(12) United States Patent
Guha et al.

(10) Patent No.: US 8,440,497 B2
(45) Date of Patent: May 14, 2013

(54) FABRICATING KESTERITE SOLAR CELLS AND PARTS THEREOF

(75) Inventors: Supratik Guha, Chappaqua, NY (US); Kejia Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 12/911,833

(22) Filed: Oct. 26, 2010

(65) Prior Publication Data
US 2012/0100664 A1 Apr. 26, 2012

(51) Int. Cl.
*H01L 21/00* (2006.01)

(52) U.S. Cl.
USPC ........ 438/86; 438/95; 438/478; 257/E31.015; 257/E31.027

(58) Field of Classification Search .................... 438/86, 438/95, 478; 257/E31.004, E31.027
See application file for complete search history.

(56) References Cited

U.S. PATENT DOCUMENTS

| | | | |
|---|---|---|---|
| 7,518,207 B1 * | 4/2009 | Chen et al. ..................... | 257/442 |
| 2003/0042851 A1 * | 3/2003 | Iwata et al. ..................... | 313/506 |
| 2011/0017289 A1 * | 1/2011 | Park et al. ..................... | 136/256 |
| 2011/0294254 A1 * | 12/2011 | Jackrel et al. ..................... | 438/95 |

FOREIGN PATENT DOCUMENTS

CN 101824638 A * 9/2010

OTHER PUBLICATIONS

Hironori Katagiri, "Cu2ZnSnS4 thin film solar cells". Thin Solid Films 480-481 (2005) 426-432.

Tooru Tanaka, et al. "Fabrication of Cu2ZnSnS4 thin films by co-evaporation" 2006 Wiley-VCH Verlag GmbH & Co. KGaA, Weinheim.

Hironori Katagiri et al. -Enhanced Conversion Efficiencies of Cu2ZnSnS4-Based Thin Film Solar Cells by Using Preferential Etching Technique. 2008 Japan Society of Appl.Phys.

Hironori Katagiri, et al. "Development of CZTS-based thin film solar cells". Thin Solid Films 517 (2009) 2455-2460.

Hironori Katagiri, et al. "The influence of the composition ratio on CZTS-based thin film solar cells". Mater. Res. Soc. Symp. Proc. vol. 1165, 2009 Materials Research Soc.

G. Zoppi, et al. "Cu2ZnSnSe4 Thin Film Solar Cells Produced by Selenisation of Magnetron Sputtered Precursors". 2009 John Wiley & Sons, Ltd.

Bjorn-Arvid Schubert, et al. "Cu2ZnSnS4 thin film solar cells by fast coevaporation". 2010 John Wiley & Sons, Ltd.

K. Wang, et al. "Thermally evaporated Cu2ZnSnS4 solar cells". Applied Physics Letters 97, 143508 2010.

Jimbo et al., "Cu2AnSnS4-type thin film solar cells using abundant materials", Thin Solid Films, Elsevier-Sequoia S. A., Lausanne, Switzerland, vol. 515, No. 15, Apr. 27, 2007, pp. 5997-5999.

Written Opinion of the International Searching Authority, International application No. PCT/EP2011 filed Oct. 19, 2011, Nov. 6, 2012.

* cited by examiner

*Primary Examiner* — Charles Garber
*Assistant Examiner* — Abdulfattah Mustapha
(74) *Attorney, Agent, or Firm* — Daniel P. Morris; Otterstedt, Ellenbogen & Kammer, LLP

(57) ABSTRACT

A Kesterite film is vacuum deposited and annealed on a substrate. Deposition is conducted at low temperature to provide good composition control and efficient use of metals. Annealing is conducted at a high temperature for a short period of time. Thermal evaporation, E-beam evaporation or sputtering in a high vacuum environment may be employed as part of a deposition process.

24 Claims, 6 Drawing Sheets

EXEMPLARY PROCESS FLOW

SODA-LIME GLASS (1-3 mm THICK)

COATED Mo BY SPUTTERING
(600 nm TO 1 μm)

DEPOSIT Cu, Zn, Sn, S, Se
BY THERMAL EVAPORATION

ANNEALING AT HIGH TEMPERATURE
ON HOT PLATE, TYPICALLY 540 °C
FOR 5 MINTUES

GROWTH OF 60-70 nm THICK CdS
BY CHEMICAL BATH DEPOSITION

DEPOSIT A THIN LAYER i-ZnO
(80-100 nm)

EXEMPLARY PROCESS FLOW

DEPOSIT TCO LAYER
(Al-ZnO OR ITO) BY SPUTTERING

FORM TOP ELECTRODE BY
EVAPORATION Ni/Al THROUGH
SHADOW MASK

ISOLATE DEVICES BY
MECHANICAL/LASER SCRIBING

DEVICE FABRICATED

FABRICATING KESTERITE SOLAR CELLS AND PARTS THEREOF

FIELD OF THE INVENTION

The present invention relates to the physical sciences, and, more particularly, to fabrication techniques and the like.

BACKGROUND OF THE INVENTION

Currently, copper indium gallium (di)selenide, also known as Cu2InGa(S,Se)4 or CIGS; and cadmium telluride (CdTe) are the major materials developed for use in thin film solar cells. With regard to the CIGS material, the prices of indium and gallium are high. Due to increasing demand in recent years for indium tin oxide (ITO) for use in flat panel displays, the price of indium continues to increase. With regard to CdTe, cadmium is toxic and tellurium is quite rare. Absorber materials comprising copper, zinc, tin and sulfur and/or selenium, offer a more economic alternative as relatively plentiful copper and zinc take the place of gallium and indium found in CIGS material.

SUMMARY OF THE INVENTION

Principles of the invention provide techniques for forming an absorber layer on a substrate; for example, for depositing $Cu_2ZnSn(S_xSe_{4-x})$, where x varies from zero to four, thin films ("CZTSSe") on substrates for solar cell applications. In one aspect, an exemplary method includes providing a substrate, subjecting the substrate to a high vacuum environment, depositing copper, zinc, tin and at least one of sulfur and selenium on a surface of the substrate by thermal evaporation while maintaining the temperature of the substrate in a sufficiently low range that re-evaporation of the materials deposited on the substrate is not substantial, thereby forming an absorber layer suitable for solar cell applications, and annealing the deposited absorber layer on the substrate at a second temperature substantially higher than the temperature maintained during the depositing step.

In a further aspect, an exemplary method includes the steps of providing a substrate having a substantially planar surface, vacuum depositing copper, zinc, tin and at least one of sulfur and selenium on the substantially planar surface of the substrate while maintaining the temperature of the substrate in a sufficiently low range that re-evaporation of the materials deposited on the substrate is not substantial, thereby forming an absorber layer suitable for solar cell applications, annealing the deposited absorber layer on the substrate at a temperature exceeding 300° C., providing an emitter layer on the absorber layer, and providing a window layer above the emitter layer.

In a further aspect of the invention, an exemplary method includes providing a substrate having a substantially planar surface; maintaining the temperature of the substrate between 100-200° C.; vacuum depositing Cu, Zn, Sn and at least one of S and Se on the substantially planar surface of the substrate, thereby forming an absorber layer suitable for solar cell applications on the substantially planar surface, and annealing the absorber layer vacuum deposited on the substrate at a temperature between 300-600° C.

As used herein, "facilitating" an action includes performing the action, making the action easier, helping to carry the action out, or causing the action to be performed. Thus, by way of example and not limitation, instructions executing on one processor might facilitate an action carried out by a piece of manufacturing or test equipment or instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof (for example, computer control of a depositing, annealing or related manufacturing or test process) can be implemented in the form of a computer product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a computer-readable storage medium (or multiple such media).

Techniques of the present invention can provide substantial beneficial technical effects. For example, one or more embodiments may provide one or more of the following advantages:

the flux of each element can be controlled individually during vacuum deposition to achieve precise composition;

the substrate can be heated during deposition;

all elements comprising the kesterite material can be deposited simultaneously;

the methods employed are environmentally safe.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Kesterite, also known as $Cu_2ZnSnS_xSe_{4-x}$, or CZTSSe, holds the promise of low-cost, renewable solar cells since all the elements used are inexpensive and earth-abundant. Unlike CIGS absorbers, which require the relatively expensive elements indium and gallium, zinc and tin are readily available at reasonable prices. kesterite films have been deposited by various techniques, including thermal evaporation, solution processes, electroplating, sputtering, and the like. Solution processes can require hydrazine which is both explosive and toxic. Sputtering techniques and electroplating typically involve the deposit of Cu/Zn/Sn alloy followed by annealing with $H_2S$ or S for more than two hours.

Most fabrication flows require high temperature annealing (>500° C.) to grow large grains for the kesterite absorber layer. Commonly used methods for high temperature annealing include annealing in a furnace with flowing $H_2S$ gas, and annealing inside a sealed tube with sufficient S vapor pressure. Such methods may exhibit issues with one or more of temperature uniformity, loss of Sn, S, and/or Se at high temperature, surface smoothness and grain size control. Furthermore, they typically require a long time for the annealing process, e.g. at annealing temperature from 1-3 hours and with an extra 1-3 hours cooling down time. Instead of high temperature annealing, another approach is to deposit materials at high substrate temperature (>400° C.). This method doesn't require a long time annealing, but the Sn/Zn loss is significant and material usage is insufficient. One or more embodiments of the invention only require five (5) to twenty (20) minutes annealing time using a hot plate. A sealed $H_2S$ chamber is not required.

Thermal evaporation is a technique which generally involves heating a solid source to produce atoms or clusters of atoms which migrate to a heated substrate under high vacuum conditions. The atoms diffuse on the substrate surface and faun a film thereon. Systems for performing thermal evaporation ordinarily include effusion cells that are focused on the substrate heater. The effusion cells contain the constituent elements employed for forming the film. A mechanism may be provided for rotating the substrate to enhance uniformity of the thin film formation. Systems using thermal evaporation deposition techniques are known to persons of ordinary skill in the art.

Figure 1:
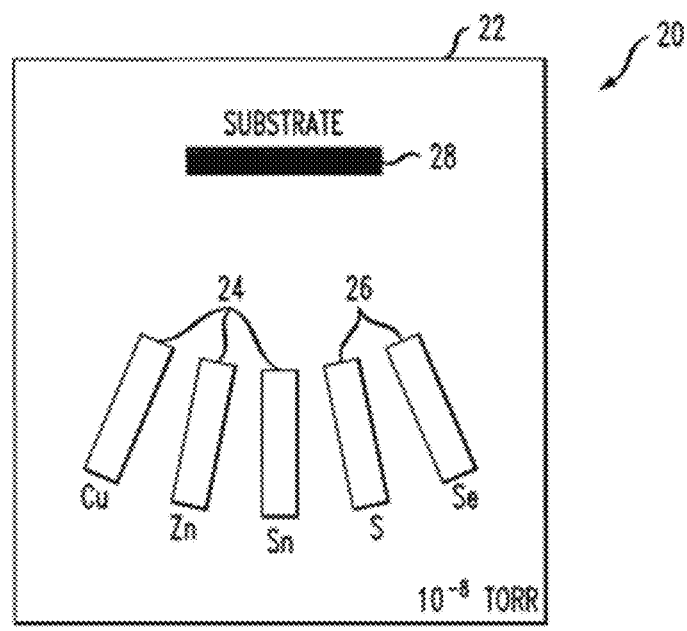
FIG. 1 is a schematic illustration of a system for depositing an absorber layer through thermal evaporation.
Figure 2:
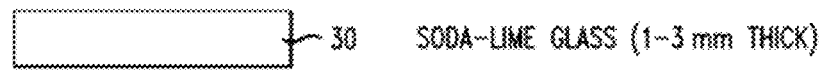
FIGS. 2-10 show the successive steps of an exemplary process flow.

Referring to FIG. 1, a schematic illustration is provided of a system 20 for depositing the elements of kesterite through thermal evaporation. For the purposes of this application, the term kesterite will be used to refer to the combination of copper, zinc, tin and at least one of sulfur and selenium. Kesterite may include sulfur and no selenium, selenium and no sulfur, or both sulfur and selenium. The term CZTS shall accordingly be used to designate kesterite that includes sulfur but no selenium while CZTSe is used to designate kesterite that has selenium but no sulfur. Kesterite containing both sulfur and selenium shall be designated as CZTSSe. The principles of the invention are applicable to forming CZTS, CZTSe and CZTSSe absorber layers usable in solar cell applications. The system 20 includes a vacuum chamber 22 capable of maintaining a high vacuum. In the exemplary process described below, the chamber is maintained at $10^{-8}$ Torr. A range of $10^{-6}$ Torr and $10^{-8}$ Torr is preferred, though other vacuum ranges may also provide acceptable results. Effusion cells 24 are provided for the copper, zinc and tin. Cracking cells 26 are provided for the sulfur and selenium. If selenium is to be omitted from the absorber layer to be formed on the substrate 28, only one cracking cell is required. A device for rotating the substrate 28 is preferably employed, though not shown in the figure.

Figure 3:
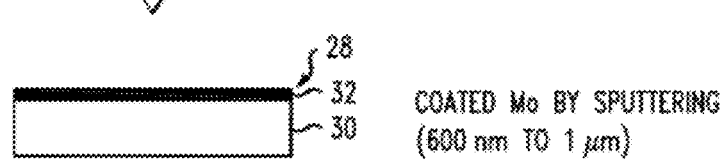
Figure 4:
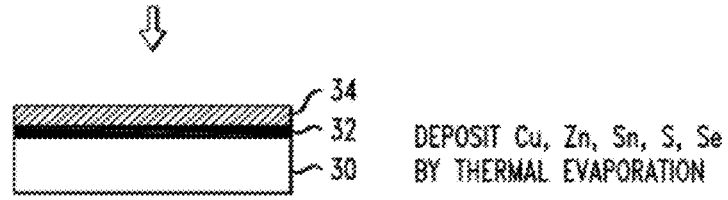

FIGS. 2-10 show exemplary processing steps of a preferred method used in creating a photovoltaic device using the principles of the invention. The substrate 28 in the exemplary method comprises soda lime glass (SLG) 30 that is coated with molybdenum. The molybdenum layer 32, which in this example has a thickness of about 600 nm to 1 µm, forms a substantially planar substrate surface, as shown in FIG. 3. The substrate 28 is positioned in the vacuum chamber 22 and heated to 100-200° C. In the exemplary process, the substrate temperature was maintained at less than 200° C., preferably 110° C. and rotated at 10-20 rpm.

The copper, zinc and tin are preferably deposited on the molybdenum coating by thermal evaporation from the effusion cells 24 in a high vacuum environment, though sputtering processes and E-beam evaporation are other vacuum deposition methods that may alternatively be employed. It will be appreciated that standard crucibles can be employed instead of effusion cells for effecting thermal evaporation. Each element is deposited at a rate of 3-5 nm/minute in the exemplary process. The deposition rate of the copper, zinc and tin is controlled by cell temperature, thereby ensuring stoichiometrically correct amounts of these elements. The low substrate temperature reduces re-evaporation so that losses of the deposited materials through re-evaporation are not substantial, thereby facilitating the production of stoichiometric films.

Assuming both elements are used in forming the CZTSSe absorber layer 34, the sulfur and selenium are stored and heated in the bulk zone (not shown) of the cracking cells 26. Needle valves (not shown) are employed to control the S/Se flux. The cracking zone of each cracking cell can, for example, crack $S_8$ to $S_4$ or $S_2$, or $Se_4$ to $Se_2$. All of the elements comprising the CZTSSe absorber layer are co-evaporated and deposited simultaneously at the above-indicated rate, resulting in the structure shown in FIG. 4. The co-evaporation of the copper, zinc and tin is controlled for exact composition of the resulting absorber layer. As discussed above, the relatively low temperature of the substrate reduces evaporative losses of these elements, particularly tin and zinc, thereby facilitating control of the stoichiometry. It is difficult to accurately compensate for evaporation losses of these elements in processes that require high substrate temperatures of 300° C. or more. Precise control of sulfur and/or selenium levels is believed to be less critical, and can be provided in amounts exceeding the targeted stoichiometric composition of the absorber layer. The thickness of the CZTSSe absorber layer formed in the exemplary process is between 650-3000 nm. Those of ordinary skill in the art will appreciate that deposition of the constituent elements of the absorber layer can be accomplished using elemental forms of the materials to be deposited or other forms, including but not limited to ZnS, ZnSe, CuS, SnS and SnSe. The vacuum deposition process described above provides a smooth surface, good composition control with no appreciable loss of tin, and is a safe, clean process. It is accordingly preferred. One or more elements could be deposited in such a high vacuum environment and low substrate temperature by sputtering or E-beam evaporation as opposed to thermal evaporation.

Figure 5:
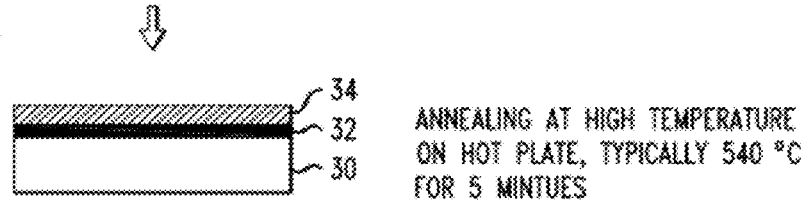

Referring next to FIG. 5, the substrate which now includes the deposited CZTSSe layer 34 is subject to a rapid annealing process where it is heated to between 300-600° C. on a hot plate for less than thirty (30) minutes. It is preferably heated for about five to twenty minutes at a temperature exceeding 500° C., preferably 500-550° C. In the exemplary process, it is heated for five minutes at 540° C. The rapid thermal annealing can be in an inert gas environment such as nitrogen or argon. S or Se vapor can be provided during annealing. Alternatively, $H_2S$ or $H_2Se$ vapor can be provided during the annealing process. It has been found that loss of deposited materials during such high temperature annealing is not significant, most likely due to the formation of the materials into small grains during the deposition process. The combination of low substrate temperature during vacuum deposition and rapid annealing thereafter at a substantially higher temperature facilitates avoiding material loss, good composition control and fast processing. The temperature used for annealing should not exceed the melting point of the substrate. Substrates other than soda lime glass may be employed that have different melting points.

Figure 10:
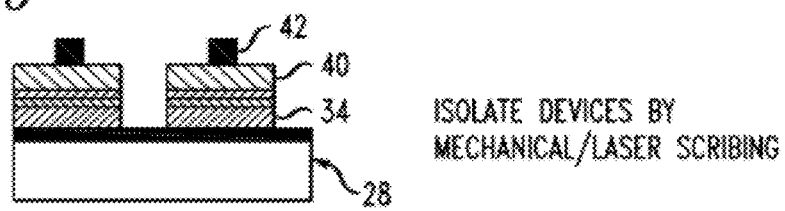

After annealing, solar cell devices can be made using additional fabrication steps, including growing an emitter layer 36 by chemical bath deposition of CdS (60-70 nm thickness) or other material, (see FIG. 6); depositing a thin layer 38 of i-ZnO (80-100 nm) (FIG. 7); depositing a transparent conduction oxide (TCO) layer 40 (see FIG. 8), such as an Al—ZnO or ITO (indium tin oxide) layer by sputtering; forming a top metal contact or electrode 42 (e.g. Ni/Al) by evaporation using a shadow mask; and isolating photovoltaic devices by mechanical/laser scribing (FIG. 10). Mechanical scribing can be done with various metal blades, such as stainless steel. CZTSSe is a soft material and can be easily removed physically without damaging the Mo substrate, For the laser scribing, the laser photon energy should be higher than the band gap energy of the CZTSSe film. For example, a green laser at a wavelength of 532 nm is a good choice to scribe CZTSSe film. A typical working range for laser power is 0.05-10 $J/cm^2$. The actual power used depends on the laser wavelength and laser pulse duration.

Figure 11:
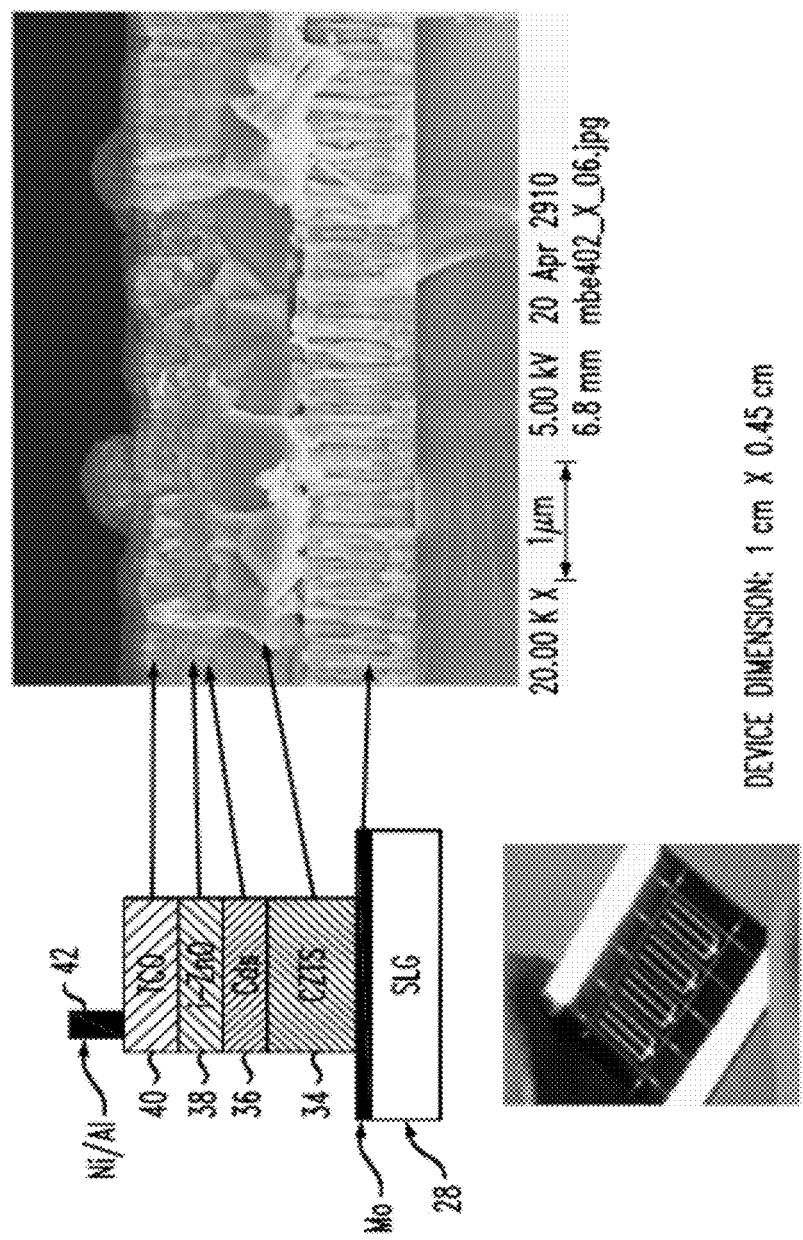
FIG. 11 shows a solar cell device fabricated in accordance with the exemplary process flow.

FIG. 11 provides sectional views of a photovoltaic device that can be fabricated in accordance with the exemplary process. The figure illustrates the layers as shown in an image taken by a scanning electron microscope and their correspondence to the various layers described above.

Figure 13:
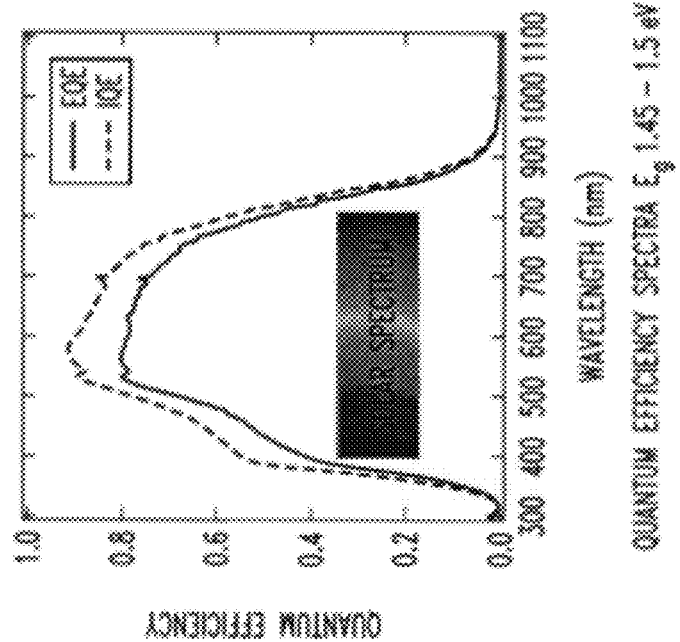
FIG. 13 shows the quantum efficiency spectra of a solar cell fabricated in accordance with the invention.
Figure 12:
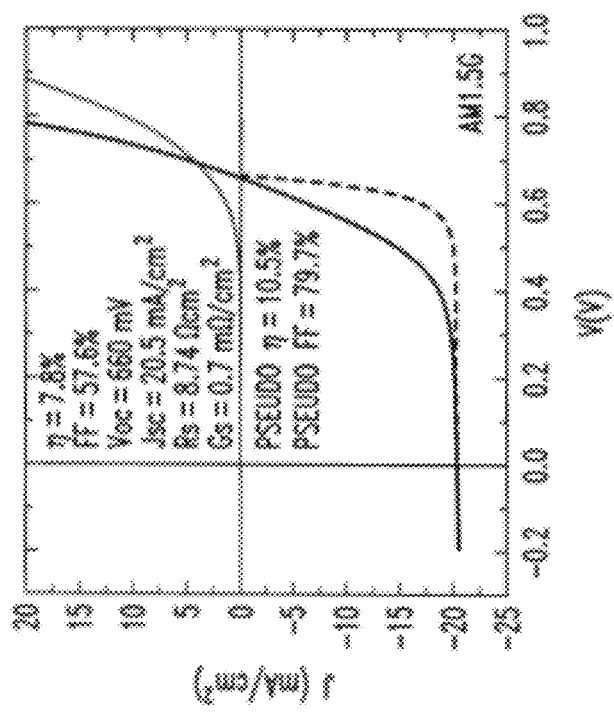
FIG. 12 shows the current voltage characteristic of a solar cell fabricated in accordance with the invention.
Figure 14:
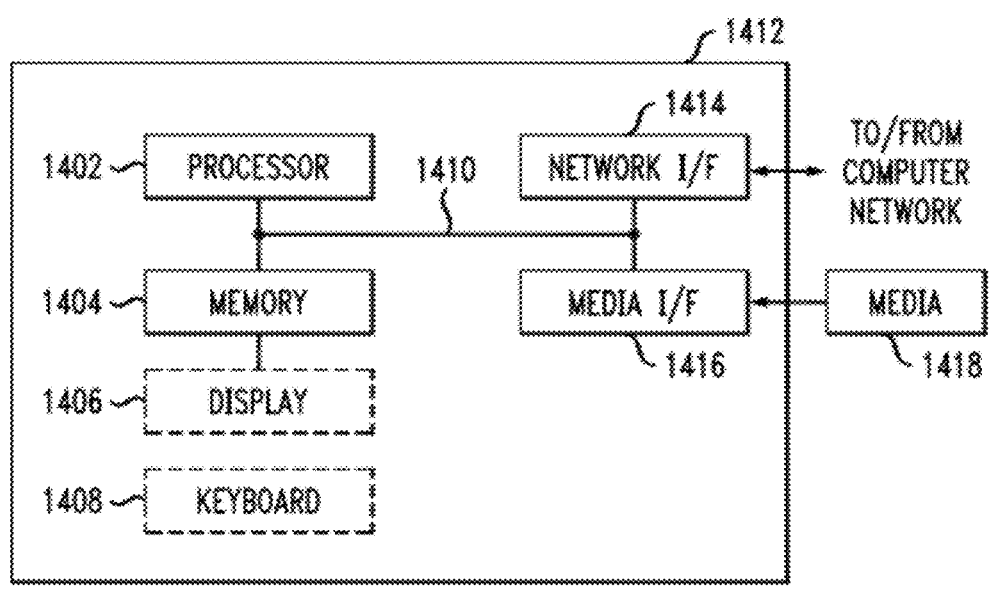
FIG. 14 depicts a computer system that may be useful in implementing one or more aspects and/or elements of the invention.

Non-limiting experimental results will now be discussed. Referring to FIG. 12, the I-V (current-voltage) characteristic of a CZTS solar cell under dark and simulated light illumination is provided. FIG. 13 shows the external and internal quantum efficiency spectra.

Given the discussion thus far, it will be appreciated that, in general terms, an exemplary method includes combining low temperature vacuum deposition and rapid, high temperature annealing to form a kesterite absorber on a substrate that is usable for solar cell applications. The low temperature deposition is accomplished through sputtering and/or thermal evaporation and/or E-beam evaporation or combined methods in a high vacuum, environment in a preferred embodiment. Thermal evaporation is a preferred technique for composition control and efficient use of the constituent metals. The high temperature annealing can be accomplished using a hot plate or other heating processes such that the absorber layer is annealed rapidly, preferably within thirty minutes and more preferably in twenty minutes or less. Such annealing can be accomplished without a special furnace and without $H_2S$. In one or more embodiments, the application of heat includes can include applying the heat directly to the substrate 28 via contact with the hot plate (not shown). In such cases, the heat is applied indirectly to the kesterite film layer 34 via conduction through the substrate 104.

Yet further, given the discussion thus far, it will be appreciated that, in general terms, an exemplary method (for example, for manufacturing solar cells) includes providing a substrate, subjecting the substrate to a high vacuum environment, heating the substrate to a first temperature, depositing copper, zinc, tin and at least one of sulfur and selenium on a surface of the heated substrate by thermal evaporation, E-beam evaporation and/or sputtering to form an absorber layer suitable for solar cell applications, and annealing the substrate at a second temperature substantially higher than the first temperature. More particularly, the first temperature is between 100-200° so re-evaporation losses are not substantial and therefore do not become problematic while the second temperature is 300° or more to facilitate rapid annealing.

Additional steps include growing an emitter layer subsequent to the annealing, depositing a transparent conduction oxide layer on the emitter layer, depositing a top metal contact on the transparent conduction oxide layer, and carrying out device isolation to obtain a plurality of solar cells.

One or more methods, techniques, and/or processes as described above can be used, for example, in the fabrication of products such as solar cells and the like.

Exemplary System and Article of Manufacture Details

As will be appreciated by one skilled in the art, aspects (e.g., for controlling a depositing, annealing, manufacturing or testing process) of the present invention may be embodied as a system, method or computer program product. Accordingly, certain portions of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of portions of the invention, or elements thereof, can be implemented in the form of an apparatus including a memory and at least one processor that is coupled to the memory and operative to perform or otherwise facilitate exemplary method steps.

One or more embodiments can make use of software running on a general purpose computer or workstation. With reference to FIG. 12, such an implementation might employ, for example, a processor 1402, a memory 1404, and an input/output interface formed, for example, by a display 1406 and a keyboard 1408. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1402, memory 1404, and input/output interface such as display 1406 and keyboard 1408 can be interconnected, for example, via bus 1410 as part of a data processing unit 1412. Suitable interconnections, for example via bus 1410, can also be provided to a network interface 1414, such as a network card, which can be provided to interface with a computer network, and to a media interface 1416, such as a diskette or CD-ROM drive, which can be provided to interface with media 1418.

Provision can be made to interface with sensors (e.g., pressure, force, temperature), actuators, and the like, for control of an annealing, manufacturing, and/or testing process or any portion thereof.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1402 coupled directly or indirectly to memory elements 1404 through a system bus 1410. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1408, displays 1406, pointing devices, and the like) can be coupled to the system either directly (such as via bus 1410) or through intervening I/O controllers (omitted for clarity).

Network adapters such as network interface 1414 may also be coupled to the system to enable the data processing system to become coupled to other data processing systems or remote printers or storage devices through intervening private or public networks. Modems, cable modem and Ethernet cards are just a few of the currently available types of network adapters.

Figure 6:
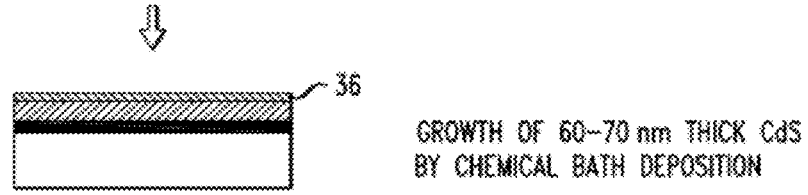
Figure 7:
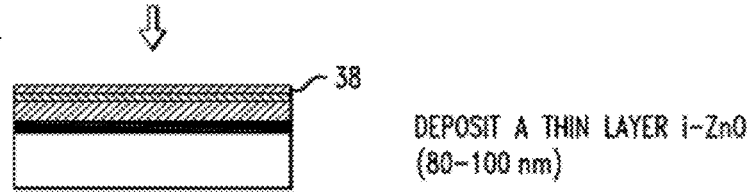
Figure 8:
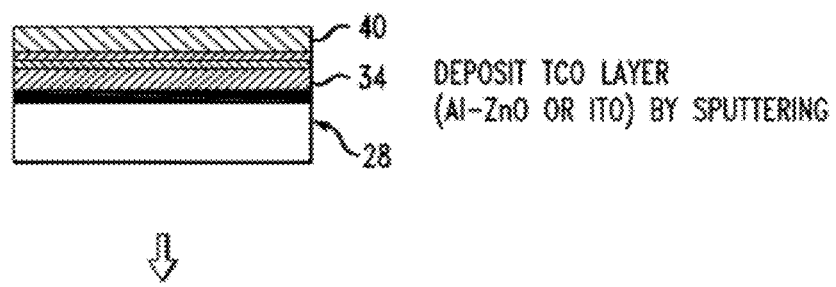
Figure 9:
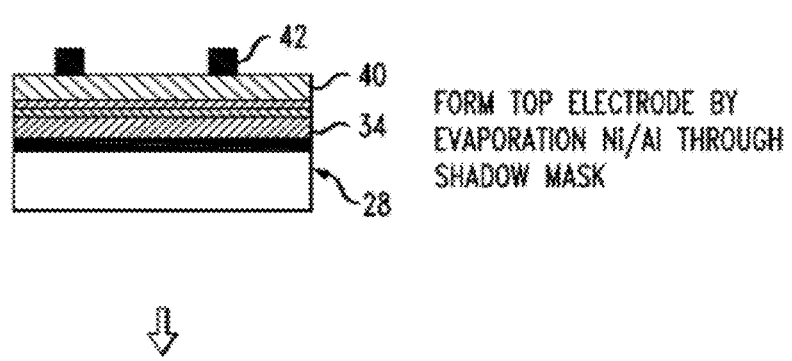

As used herein, including the claims, a "server" includes a physical data processing system (for example, system 1412 as shown in FIG. 6) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1418 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, modules to carry out, control, and/or facilitate any annealing, manufacturing, or testing as described herein (e.g., control an annealing heat source). The method steps can then be carried out using the distinct software modules and/or sub-modules of the system, as described above, executing on one or more hardware processors 1402. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   providing a substrate;
   subjecting the substrate to a high vacuum environment;
   depositing copper, zinc, tin and at least one of sulfur and selenium on a surface of the substrate in the high vacuum environment by thermal evaporation while maintaining the temperature of the substrate in a sufficiently low range that re-evaporation of the materials deposited on the substrate is not substantial, thereby forming an absorber layer suitable for solar cell applications, and
   annealing the deposited absorber layer on substrate at a second temperature substantially higher than the temperature maintained during the depositing step.

2. The method of claim 1 wherein the copper, zinc, tin and sulfur and/or selenium are deposited simultaneously on the substrate, the temperature range during depositing is between 100-200° C., the second temperature is over 500° C., and annealing is conducted for less than thirty minutes.

3. The method of claim 2, wherein the substrate is annealed in the presence of sulfur.

4. The method of claim 2, wherein the copper, zinc and tin are deposited through effusion cells.

5. The method of claim 4, wherein sulfur and/or selenium is deposited via a cracking cell.

6. The method of claim 1, wherein the substrate comprises glass having a surface comprising a molybdenum coating, the absorber layer being deposited on the molybdenum coating.

7. The method of claim 1 further including the steps of:
   providing an emitter layer on the absorber layer, and
   depositing a window layer on the emitter layer.

8. The method of claim 1, further including providing one or more of the copper, zinc, tin and the at least one of sulfur and selenium in non-elemental form prior to thermal evaporation.

9. The method of claim 1, wherein the copper, zinc, tin and the at least one of sulfur and selenium are simultaneously deposited at a rate between about three and five nm/minute in a vacuum maintained between $10^{-6}$ and $10^{-8}$ Torr and at a temperature between 100-200° C., and annealing is conducted for less than thirty minutes at a temperature exceeding 300° C.

10. A method comprising:
    providing a substrate having a substantially planar surface;
    simultaneously vacuum depositing copper, zinc, tin and at least one of sulfur and selenium on the substantially planar surface of the substrate while maintaining the temperature of the substrate in a sufficiently low range that re-evaporation of the materials deposited on the substrate is not substantial, thereby forming an absorber layer suitable for solar cell applications;
    annealing the vacuum deposited absorber layer on the substrate at a temperature exceeding 300° C. for less than thirty minutes;
    providing an emitter layer on the absorber layer, and
    providing a window layer above the emitter layer.

11. The method of claim 10, wherein at least one of the copper, zinc, tin and at least one of sulfur and selenium is vacuum deposited on the substantially planar surface in elemental form.

12. The method of claim 10, further including controlling the flux of each of the copper, zinc, tin, and at least one of sulfur and selenium while vacuum depositing them on the substantially planar surface of the substrate.

13. The method of claim 10, wherein the substantially planar surface of the substrate comprises molybdenum.

14. The method of claim 10 wherein the substrate is maintained between 100-200° C. as the copper, zinc, tin and at least one of sulfur and selenium are vacuum deposited on the substantially planar surface and the step of annealing the absorber layer takes place at a temperature exceeding 500° C.

15. The method of claim 14, wherein sulfur is deposited on the substantially planar surface of the substrate via a cracking cell and copper, zinc and tin are vacuum deposited simultaneously on the substantially planar surface via effusion cells.

16. The method of claim 14, wherein the substrate comprises glass and the substantially planar surface of the substrate comprises molybdenum.

17. The method of claim 15, wherein the sulfur, copper, zinc and tin are vacuum deposited at a rate of 3-5 nm/minute in a vacuum maintained between $10^{-6}$ and $10^{-8}$ Torr.

18. The method of claim 15, wherein the emitter layer comprises CdS and is provided by chemical bath deposition and the window layer comprises i-ZnO and Al—ZnO, the window layer being provided by sputtering.

19. A method comprising:
 providing a substrate having a substantially planar surface;
 maintaining the temperature of the substrate between 100-200° C.;
 vacuum depositing Cu, Zn, Sn and at least one of S and Se on the substantially planar surface of the substrate, thereby forming an absorber layer suitable for solar cell applications on the substantially planar surface, and
 annealing the absorber layer vacuum deposited on the substrate at a temperature between 300-600° C.

20. The method of claim 19, wherein the substantially planar surface comprises molybdenum.

21. The method of claim 19, including annealing the absorber layer at a temperature greater than 500° C. for between five and twenty minutes.

22. The method of claim 19, further including providing an emitter layer on the absorber layer and window layer over the emitter layer.

23. The method of claim 19, wherein the elements comprising the absorber layer are deposited by thermal evaporation in a vacuum maintained between $10^{-6}$ and $10^{-8}$ Torr.

24. The method of claim 19, wherein at least one of the elements comprising the absorber layer is deposited by sputtering.

* * * * *